United States Patent [19]

Okuno

[11] Patent Number: 5,714,004
[45] Date of Patent: Feb. 3, 1998

[54] PROCESS FOR PRODUCING POLYCRYSTALLINE SEMICONDUCTORS

[75] Inventor: Tetsuhiro Okuno, Shiki-Gun, Japan

[73] Assignee: Sharp Kabushiki Kaisha, Osaka, Japan

[21] Appl. No.: 645,086

[22] Filed: May 13, 1996

[30] Foreign Application Priority Data

Jun. 15, 1995 [JP] Japan ................................ 7-149179

[51] Int. Cl.$^6$ .................................................. C30B 15/14
[52] U.S. Cl. ........................................ 117/3; 117/13
[58] Field of Search .................. 23/301; 117/1, 117/2, 14, 15, 201, 202, 203, 204, 3

[56] References Cited

U.S. PATENT DOCUMENTS

| | | | |
|---|---|---|---|
| 3,898,051 | 8/1975 | Schmid | 117/83 |
| 4,133,969 | 1/1979 | Zumbrunnen | 117/202 |
| 4,175,610 | 11/1979 | Zauhar et al. | 164/122.2 |
| 4,233,270 | 11/1980 | Schmidt | 117/202 |
| 5,162,072 | 11/1992 | Azad | 117/201 |

FOREIGN PATENT DOCUMENTS

| | | | |
|---|---|---|---|
| 57-21515 | 5/1982 | Japan . | |
| 58-54115 | 12/1983 | Japan . | |
| 62-260710 | 11/1987 | Japan . | |
| 2229791 | 9/1990 | Japan | 117/204 |
| 2 279 585 A | 1/1995 | United Kingdom . | |

OTHER PUBLICATIONS

D.E. Holmes et al., Journal Electrochemical Society, vol. 128, No. 2, Feb. 1981, pp. 429–437.

*Primary Examiner*—Felisa Garrett
*Attorney, Agent, or Firm*—Birch, Stewart, Kolasch & Birch, LLP

[57] ABSTRACT

For the highly repeatable growth of high-quality semiconductor polycrystals with excellent crystallographic properties, at a low cost, there are provided a process for producing a polycrystalline semiconductor including charging a raw semiconductor material into a crucible with semiconductor seed crystals placed on its bottom in an atmosphere inert to the semiconductor, heating to melt the raw semiconductor material in the crucible by heating means while depriving the bottom of the crucible of heat to maintain the underside temperature T1 of the bottom below the melting point of the raw semiconductor material, and then cooling the crucible to solidify the melted material, wherein the underside temperature T1 of the bottom of the crucible under heating is measured, and the heating by the heating means is suspended when the rate Δt of time-dependent change of the temperature increases over a predetermined value, to thereby melt only the raw semiconductor material, substantially without melting the seed crystals, and the melted raw material is then solidified to grow a polycrystal from the seed crystals, as well as a manufacturing apparatus therefor.

5 Claims, 4 Drawing Sheets

PROCESS FOR PRODUCING POLYCRYSTALLINE SEMICONDUCTORS

BACKGROUND OF THE INVENTION

1. Field of the Invention

The present invention relates to a process and an apparatus for producing polycrystalline semiconductors. More particularly, it is concerned with a process and an apparatus for producing polycrystalline silicon semiconductors with excellent crystallographic properties.

2. Description of the Related Art

Silicon is an excellent raw material for production of industrial products, and is used, for example, as a semiconductor material for preparation of ICs (integrated circuits), etc., and as a material for preparation of solar cells; it is a really excellent material from the standpoint of resource that finds many applications in the afore-indicated areas. More specifically, silicon is the material used for almost all the solar cell materials now in practical use. The currently dominating solar cells for power supply are based on single-crystal silicon, and thus further development of solar cells made of high-quality polycrystalline silicon is expected for cost reduction.

According to the conventional process for producing polycrystalline silicon semiconductors, solid silicon in a silica crucible is melted in a heating furnace, and is then cast into a graphite crucible. Another recently known method is melting in a vacuum or in an inert gas to prevent mixing of oxygen or nitrogen gas, etc. into the silicon to thereby improve the quality and prevent dusting. Additional known processes include the semi-continuous casting furnace process of Wacker-Chemitronie GmbH in Germany, wherein silicon is melted in a vacuum or in an inert gas in a silica crucible, and is then poured into a mold made of graphite or the like by inclining the crucible; the HEM (Heat Exchange Method) of Crystal Systems, Inc. in the U. S., wherein silicon is melted in a vacuum in a silica crucible, and is then solidified directly wherein; the process of Sumitomo SiTiX, Inc. in Japan, an improvement of the Wacker' process, wherein a water-cooled steel plate is used as the silicon melting crucible; etc.

A modification of the HEM which uses a seed crystal is disclosed in Japanese Examined Patent Application Publication SHO 58-54115. In this process, the temperature of the melting material (sapphire, germanium or the like) is detected by both visual observation and measurement of the absolute temperature of a thermocouple. Results of visual observation vary due to clouding of the glass as the crystal grows, and thus are poorly reproducible. Since the absolute temperatures of thermocouples naturally change markedly with time when used for high temperatures (e.g., 1400° C. or higher), results of the process which involves the use of a thermocouple are poorly reproducible as well. As a result, it is conventional to use the detected melting temperature of the material as an approximate guide for commencement of circulating helium gas or the like to cool the bottom of the crucible to thereby prevent melting of the seed crystal. This process, however, is not practical for industrial production of crystals, since helium gas is very expensive. In addition, although crystal growth processes which involve the use of seed crystals require melting all the materials other than the seed crystals, the materials around the seed crystals may remain unmelted according to the HEM, and thus the process is not believed to be reliably controllable.

SUMMARY OF THE INVENTION

In view of the problems mentioned above, it is an object of the present invention to provide an improvement of the HEM, or a process for growing a polycrystalline semiconductor with excellent crystallographic properties from seed crystals in a crucible, a process for producing a polycrystalline semiconductor using the process, and an apparatus for its production.

A characteristic aspect of the present invention lies in a process for growing a semiconductor polycrystal from seed crystals by placing the semiconductor seed crystals on the bottom of a crucible, charging a raw semiconductor material into the crucible, heating the crucible while controlling the underside temperature of the bottom of the crucible to melt the raw semiconductor material, without melting the seed crystals, and then cooling the crucible.

The present invention provides a process for producing a polycrystalline semiconductor comprising charging a raw semiconductor material into a crucible with semiconductor seed crystals placed on its bottom in an atmosphere inert to the semiconductor, heating to melt the raw semiconductor material in the crucible by heating means while depriving the bottom of the crucible of heat to maintain the underside temperature T1 of the bottom below the melting point of the raw semiconductor material, and then cooling the crucible to solidify the melted material, characterized in that the underside temperature T1 of the bottom of the crucible under heating is measured, and the heating by the heating means is suspended when the rate $\Delta t$ of time-dependent change of the temperature with time increases over a predetermined value, to thereby melt only the raw semiconductor material, substantially without melting the seed crystals, and the melted raw material is then solidified to grow a polycrystal from the seed crystals.

The predetermined value in the above process is preferred to be within the range of about 0.2° C./min. to about 0.5° C./min.

The seed crystals are preferably spread on the entire bottom surface of the crucible.

The seed crystals are also preferred to be about 10 mm or more in thickness.

The thicknesses of the seed crystals are preferred to be greater at the center of the crucible than at its periphery.

The present invention provides an apparatus for producing polycrystalline semiconductors comprising:

an airtight vessel;

a crucible placed in the airtight vessel for receiving semiconductor seed crystals and a raw semiconductor material;

heating means for heating the crucible at a level above its bottom to melt the raw semiconductor material;

a first-temperature detecting means for detecting a first temperature T1 of the bottom underside of the crucible;

a second-temperature detecting means for detecting a second temperature T2 at which the crucible is heated by the heating means; and control means for controlling the heating means so that the second temperature T2 increases over the melting temperature of the raw semiconductor material in response to respective outputs of the first-temperature detecting means and the second-temperature detecting means, and so that the second temperature T2 falls at the instant the rate $\Delta T$ of time-dependent change of the first temperature T1 detected by the first-temperature detecting means increases over a predetermined value.

The apparatus is preferred to be further provided with a supporting bed to support the bottom underside of the crucible for its mounting, driving means for driving rotation of the supporting bed about the vertical axis to drive its ascent and descent, and cooling means for cooling the portion of the supporting bed below the first-temperature detecting means provided in the top of the supporting bed, exposed upward and in contact with the bottom underside of the mounted crucible.

The raw semiconductor material used in the process and the apparatus for producing polycrystalline semiconductors is preferred to be polysilicon, in which case polycrystalline silicon is produced as the polycrystalline semiconductor.

According to the present invention, in a process for producing a polycrystalline semiconductor comprising charging a raw semiconductor material into a crucible with semiconductor seed crystals placed on its bottom in an atmosphere inert to the semiconductor, heating to melt the raw semiconductor material in the crucible by heating means while depriving the bottom of the crucible of heat to maintain the underside temperature T1 of the bottom below the melting point of the raw semiconductor material, and then cooling the crucible to solidify the melted material, the underside temperature T1 of the bottom of the crucible under heating is measured, and the heating by the heating means is suspended when the rate $\Delta t$ of time-dependent change of the temperature increases over a predetermined value, to thereby melt only the raw semiconductor material, substantially without melting the seed crystals, and the melted raw material is then solidified to grow a polycrystal from the seed crystals.

The crucible is heated by heating means provided at a distance from the crucible in a conventional manner, and radiant heat is applied from the top of the crucible to the raw semiconductor material in the crucible to melt the material. The sidewall of the crucible is also heated by the heating means to higher temperatures to facilitate melting of the raw semiconductor material. Here, the melting of the raw semiconductor material is performed in an atmosphere inert to the semiconductor.

Since the raw semiconductor material absorbs heat when it melts, control of the electric power supplied to the heating means by the control means to maintain the temperature of the crucible at a constant value results in a lower amount of heat required to melt the material remaining in the crucible, and this causes increase of the temperature of the crucible, particularly the temperature of the bottom underside of the crucible. Accordingly, the change of the underside temperature T1 of the bottom of the crucible reflects the progress of melting of the raw semiconductor material in the crucible, and therefore the heating of the crucible by the heating means is immediately suspended when the measured rate $\Delta T$ of time-dependent change of the temperature increases over a predetermined value. This prevents melting of the seed crystals on the bottom of the crucible. In this state, slow cooling of the crucible is initiated, and the melted raw semiconductor material begins to solidify around the seed crystal cores which remain unmelted to grow a crystal of a polycrystalline semiconductor which is orientated upward from the bottom of the crucible. Since the desired control of the underside temperature T1 of the bottom of the crucible, which is difficult to accomplish according to the conventional HEM, is accomplished as described above, a high-quality semiconductor polycrystal, i.e. with excellent crystallographic properties, may be grown repeatedly.

Further, setting the rate $\Delta T$ of time-dependent change of the underside temperature T1 of the bottom of the crucible to a value within the range of approximately 0.2° C./min. to 0.5° C./min. prevents melting of the seed crystals to improve the quality of the resulting polycrystalline semiconductor. In cases where $\Delta T$ is less than 0.2° C./min., not only the seed crystals but also the raw semiconductor material remain unmelted, and thus no homogeneous semiconductor polycrystal is produced. On the other hand, the seed crystals may be melted as well when $\Delta T$ is over 0.5° C./min., and this may prevent growth of a satisfactory polycrystal.

In addition, when the seed crystals are spread on the entire bottom of the crucible, a semiconductor crystal grows with uniform orientation from the bottom to the top of the crucible to improve the quality of the resulting polycrystalline semiconductor.

Additionally, the seed crystals melt less when each seed crystal has a thickness of about 10 mm or more, and this also serves to improve the quality of the resulting polycrystalline semiconductor.

In addition, in cases where the thicknesses of the seed crystals located in the center of the crucible are designed to be greater than those of the seed crystals located in the inner periphery, melting of the seed crystals located in the inner periphery of the crucible is prevented, and this also serves to improve the quality of the resulting polycrystalline semiconductor.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
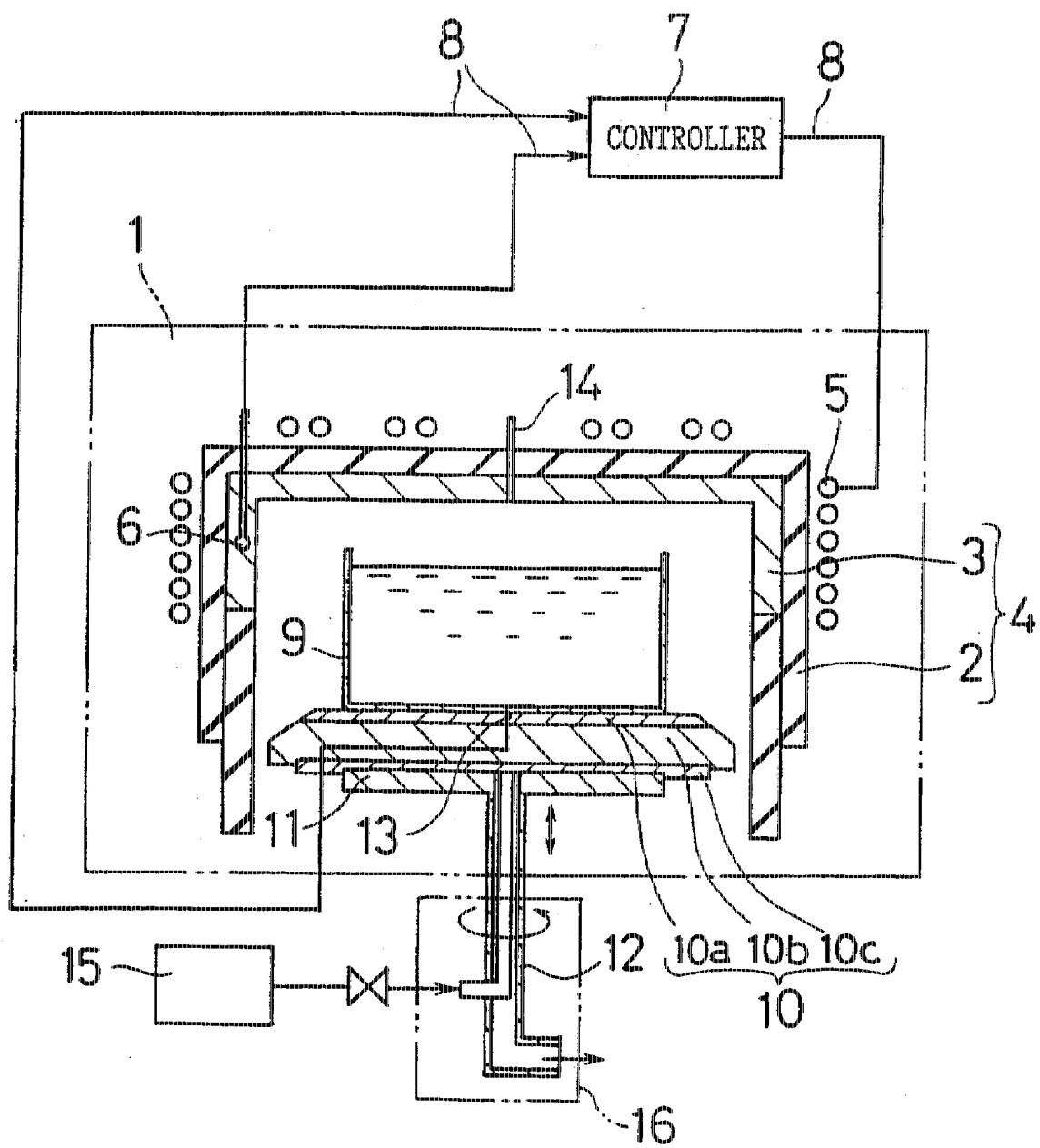
FIG. 1 is a schematic longitudinal section illustrative of the configuration of an apparatus for producing polycrystalline semiconductors according to the present invention.

Now referring to the drawings, preferred embodiments of the invention are described below.

Throughout the specification and the claims, "under an inert atmosphere" means "in a vacuum or under an atmosphere of an inert gas which prevents oxidation of the heated raw semiconductor material present" which is realized in an airtight vessel. Also, throughout the specification and the claims, "the underside temperature of the bottom of the crucible" and "a first temperature detected by first-temperature detecting means" refer to the same temperature indicated by T1, and these expressions are used interchangeably for convenience.

The process and the apparatus for producing polycrystalline semiconductors according to the present therein will now be explained in detail with reference to FIG. 1 through FIG. 5. Although the raw semiconductor material available for use according to the present invention is exemplified by only silicon, other materials such as germanium (Ge) may be used as well.

FIG. 1 is a schematic longitudinal section illustrative of the configuration of an apparatus for producing polycrystalline semiconductors according to the present invention. This apparatus contains an airtight vessel 1 which prevents passage of air. The airtight vessel 1 may be configured to be connected to an exterior vacuum pump via a vacuum-tight door (not shown) to produce a vacuum inside the vessel. Alternatively, the vessel may be designed so as to internally circulate an inert gas (e.g., argon) at normal pressure, in which case the semiconductor heated to a melt in the vessel is not adversely affected by oxidation, since the atmosphere inside the vessel is non-oxidative.

As shown in the drawing, in the airtight vessel 1 there is provided a cylindrical heating furnace 4 comprising a heat insulator 2 and a heating member 3, located at a distance from the sidewall of the vessel. Both the heat insulator 2 and the heating member 3 are made of carbon fibers or graphite, for example. The heating member 3 may be constructed of an electric conductor such as metal. An induction heating coil 5 (at a frequency of 10 KHz) is wound around the heating furnace 4, particularly along the portion of its outer surface facing the heating member 3. The induction heating coil 5 heats the heating member 3 when energized. A first thermocouple 6 for measuring the temperature T2 (a second temperature) of the heating member 3 is buried in the sidewall of the heating member 3, sheathed in an installation tube.

The first thermocouple 6 and the induction heating coil 5 are connected to a controller 7 provided outside the airtight vessel 8 via respective leads 8. The controller 7 is designed to control power supply to the conduction heating coil 5 in response to output from the first thermocouple 6, to thereby increase or decrease the temperature of the heating furnace 4 as desired.

A crucible 9 into which a raw semiconductor material and seed crystals are charged, is placed inside the airtight vessel 1. As shown in FIG. 1, the crucible 9 is placed in the inner space confined by the heating furnace 4 at proper distances from the sidewall and the top of the heating furnace 4. The crucible 9 may be made of a silica material or a graphite material, for example; it may also be made of another material such as tantalum, molybdenum, tungsten, silicon nitride or boron nitride. The crucible 9 may be shaped as desired as long as its geometry matches the inner configuration of the heating furnace 4, and may be either cylindrical or shaped as a square pole.

The crucible 9 is placed in the airtight vessel 1, with the bottom supported on the supporting bed 10. The supporting bed 10 is preferred to have a laminated structure constructed of a surface layer 10a and a bottom layer 10c made of graphite, and an intermediate layer 10b made of carbon fibers. The supporting bed 10 is mounted on a pedestal 11, and a cylindrical member 12 extending downward from the pedestal 11 allows the pedestal 11 to rotate about the central longitudinal axis. The rotation of the cylindrical member 12 is propagated to the crucible 9 via the pedestal 11 and the supporting bed 10, and therefore the crucible 9 also rotates as the cylindrical member 12 rotates. When a raw semiconductor material is charged into the crucible 9, and the crucible 9 is heated in the heating furnace 4, the rotation serves to provide the raw semiconductor material in the crucible 9 with an even distribution of temperature.

Figure 2:
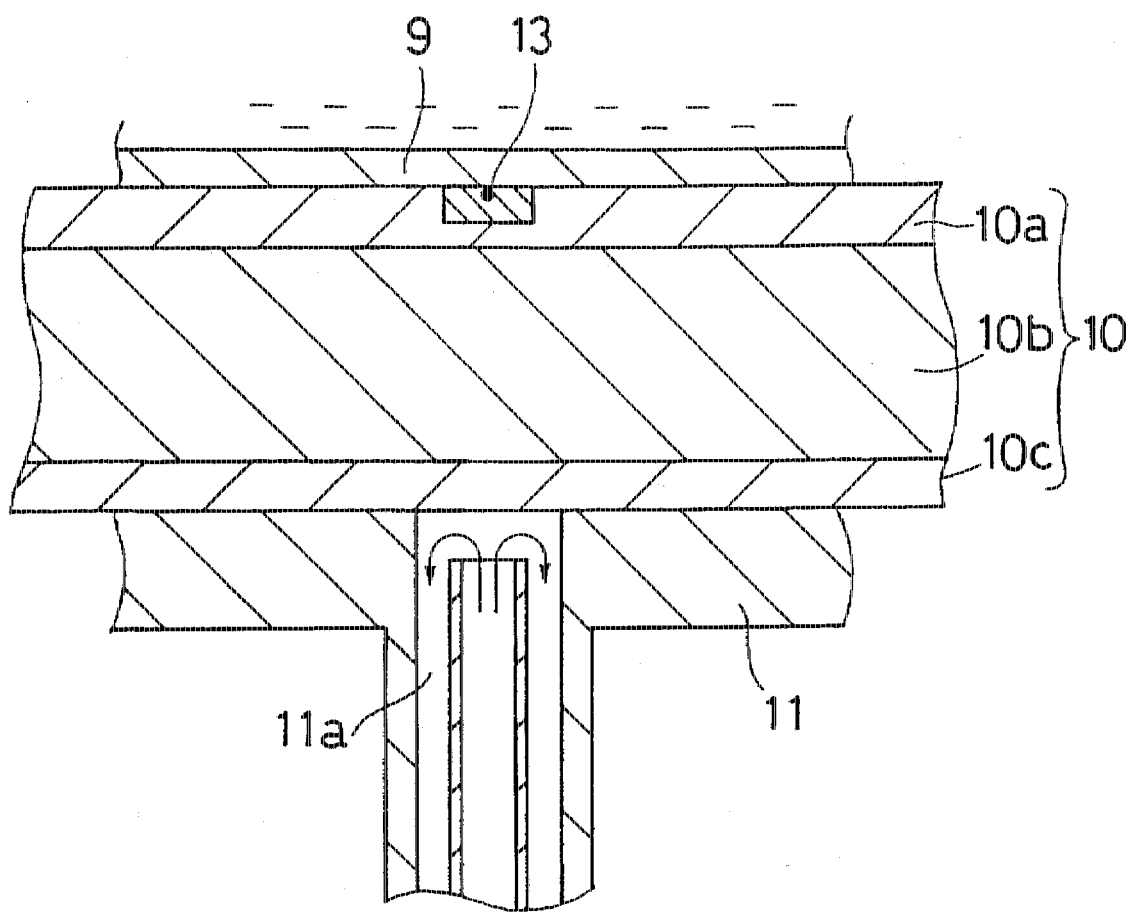
FIG. 2 is an enlarged longitudinal section of the main portion of the apparatus for producing polycrystalline semiconductors according to the present invention.

FIG. 2 is an enlarged view of the main portion of the apparatus shown in FIG. 1, illustrative of the center of the bottom of the crucible 9 and its vicinity. The pedestal 11 with a hollow double structure is equipped with a cooling section 11a, and the cylindrical member 12 is also formed as a double pipe. A cooling medium (for example, cooling water) is forcedly circulated through the two to cool the supporting bed 10 supported on the pedestal 11. The cooling medium is continuously supplied from a cooling medium tank 15 to the cylindrical member 12. As a result, this cooling mechanism allows the supporting bed 10 to exchange heat with the underside of the bottom of the crucible which is in contact therewith to cool the bottom. The pedestal 11 and the cylindrical member 12 are driven to move up or down by driving means 16 provided outside the airtight vessel 1, and the crucible 9 is lifted or lowered in tandem with their upward or downward movement. The distance between the heating furnace 4 and the crucible 9 may be made shorter or longer in this manner. In addition, as mentioned above, the driving means 16 drives the rotation of the cylindrical member 12 about the axis.

A pyrometer 14 is attached to the head of the heating furnace 4, that is, the portion of the heating member 3 located just above the crucible 9. This pyrometer detects the radiant heat of the raw semiconductor material in the crucible 9 to measure the surface temperature of the material. Accordingly, the pyrometer 14 is useful to determine the progress of melting of the charged raw semiconductor material while it is heated to a melt, or the progress of solidification of the material while it is cooled to solidity.

A characteristic aspect of the configuration of the producing apparatus according to the present invention resides in a second thermocouple 13 which is in contact with the underside of the bottom near the bottom center of the crucible 9, buried in the surface layer 10a of the supporting bed 10. This thermocouple 13 is used to measure the underside temperature T1 (a first temperature) of the bottom of the crucible, and is electrically connected to the controller 7 via a lead in the same manner as the first thermocouple 6. Accordingly, the controller 7 allows control of power supply to the induction heating coil 5 to increase or decrease the temperature of the heating furnace 4 in response to output from the second thermocouple 13.

Figure 3:
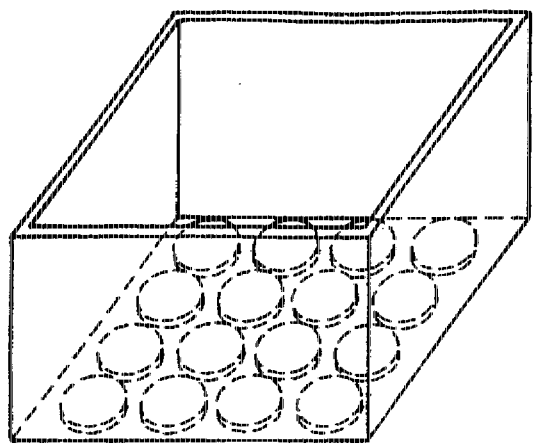
FIG. 3 is a perspective view illustrative of the state of semiconductor material seed crystals placed on the bottom of the crucible used in the present invention.

FIG. 3 is a perspective view of an embodiment of the crucible 9 used in the present invention. Referring to the drawing, semiconductor seeds are spread on the entire bottom surface of the crucible 9.

Figure 4:
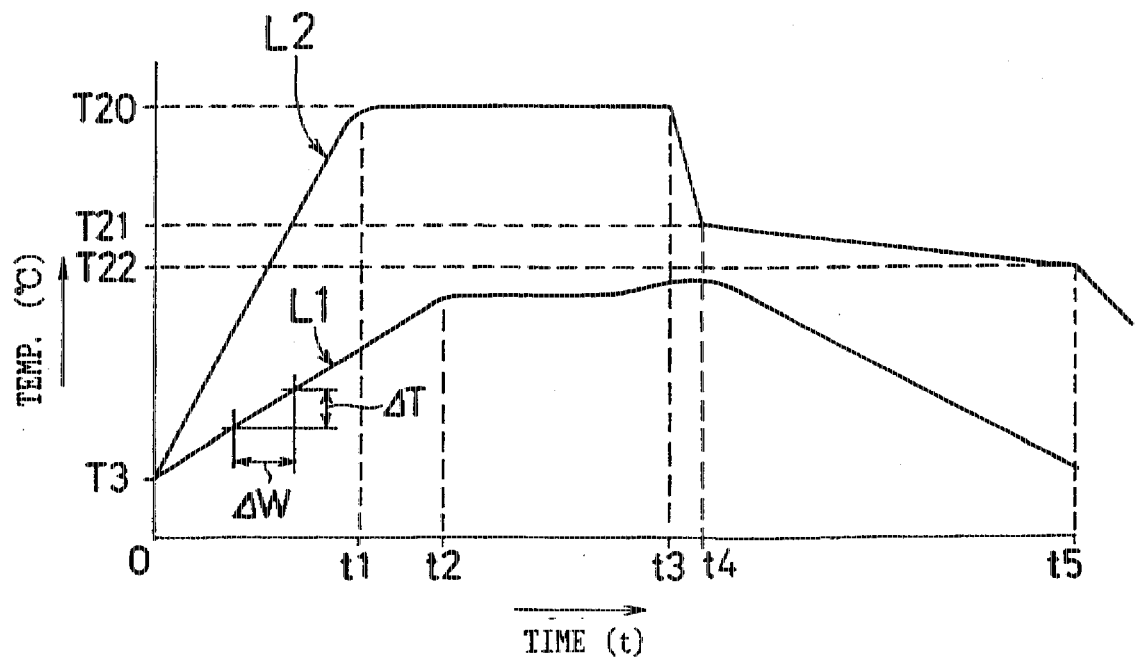
FIG. 4 is a graph showing the changes of temperatures T2 and T1 detected by a first thermocouple 6 and a second thermocouple 13.
Figure 5:
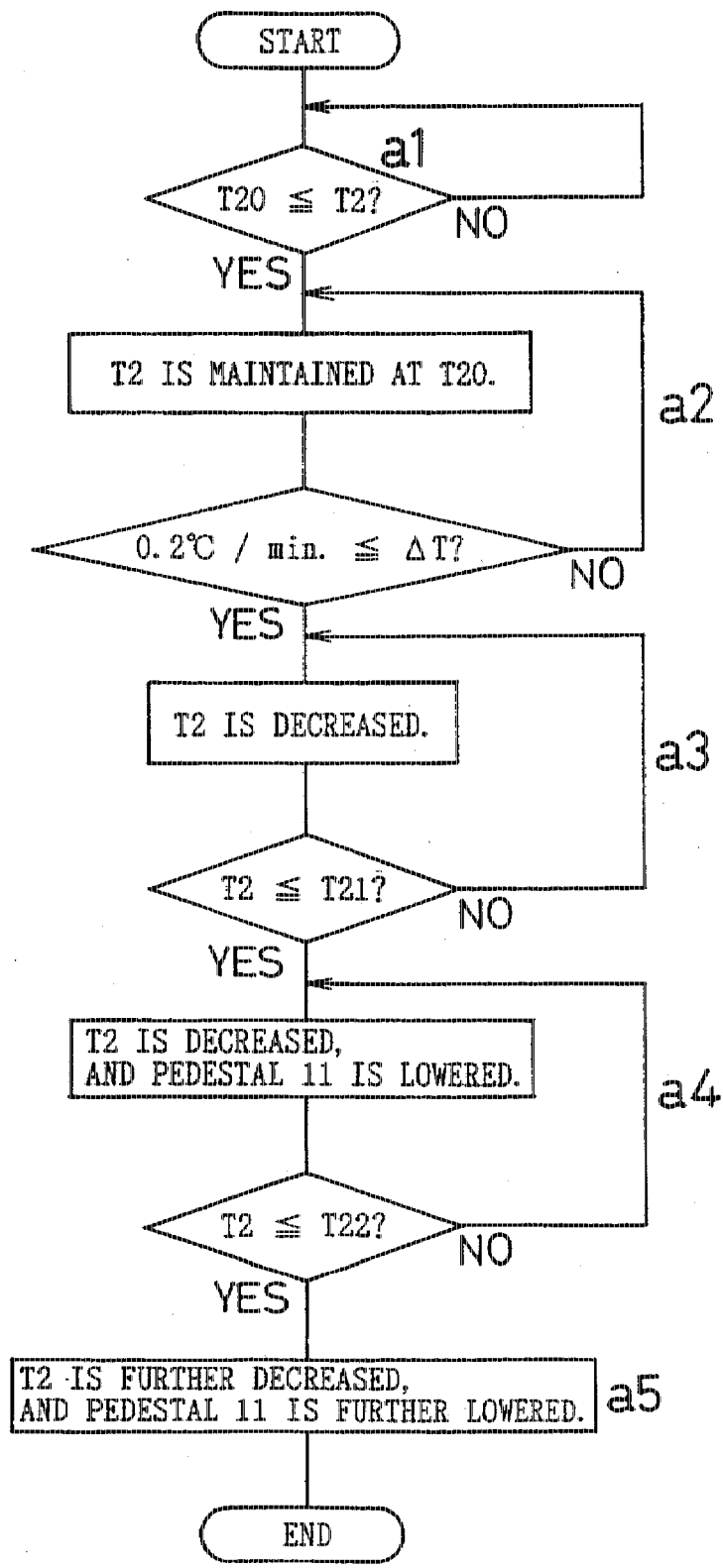
FIG. 5 is a flow chart illustrative of the operation of the control section shown in FIG. 1.

FIG. 4 is a graph illustrative of the time-dependent change of the temperatures (output temperatures) T2 and T1 detected by the first thermocouple 6 and the second thermocouple 13. In the graph, L1 indicates the curve of T1, and L2 indicates the curve of T2. FIG. 5 is a flow chart illustrative of the operation of the controller 7 shown in FIG. 1. The controller 7 is used to perform the steps shown in FIG. 5 in response to output of the detected temperature T1 from the second thermocouple 13 and of the detected temperature T2 from the first thermocouple 6. According to the present invention, it is also possible to track the change of T1 and T2 with time in FIG. 4, for example, instead of referring to a flow chart as shown in FIG. 5, to manually operate the controller 7 for the step of increasing or decreasing the temperature of the heating furnace 4 and the other steps of lifting or lowering the cylindrical member 12, for example.

Each step of the process for producing a polycrystalline semiconductor according to the present invention will now be explained in detail. First, it is preferred to charge a raw semiconductor material, polysilicon, into the crucible 9 outside the airtight vessel 1.

The polysilicon-containing crucible 9 is placed on the top surface of the supporting bed 10 mounted on the pedestal 11, with the center of the crucible 9 being aligned with the centers of the pedestal and the supporting bed. The driving means 16 is used to lift the cylindrical member 12 and the pedestal 11, and the crucible 9 is placed at a predetermined location inside the heating furnace 4. Prior to operation of the heating furnace 4, water is circulated through the pedestal 11 and the cylindrical member 12, and it is ascertained whether the bottom, particularly the bottom underside of the crucible 9 is cooled by the cooling mechanism.

In addition, prior to heating of the heating furnace 4, the cylindrical member 12 is rotated about the vertical axis by the driving means 16 to ensure uniform heating of the polysilicon in the crucible 9. A voltage is then applied across the induction heating coil 5 to heat the heating member 3 to thereby generate radiant heat which is used to heat the polysilicon in the crucible 9.

For the sake of clarity, the heating and the cooling steps according to the present invention will now be explained with reference to the flow chart of FIG. 5. Referring to FIG. 5, an AC with a frequency of approximately 7 kHz is applied across the induction heating coil 5 at step a1 to initiate its heating when its temperature is T3 (e.g., ambient temperature). The heating to increase the temperature is performed at a temperature gradient of approximately 400° C./hr. until the temperature T2 detected by the first thermocouple 6 reaches a predetermined temperature T2, for example, approximately 1540° C. (until time t1, typically about 4.5 hours after the heating is initiated). Step a1 is repeated so long as determination at step a1 results in a "NO", whereas upon a "YES" result the process proceeds to step a2 where electric power is supplied to the induction heating coil 5 to maintain the temperature T2 detected by the first thermocouple 6 at a predetermined temperature T20 under control by the controller 7.

At step a2, the polysilicon in the crucible 9 reaches its melting temperature (approximately 1420° C.), and the melting proceeds from the top to the bottom of the crucible. The progress of melting may be monitored by the pyrometer 14. Since the cooling medium is circulated through the pedestal 11 as shown in FIG. 2, to cool the supporting bed 10 and further the bottom underside of the crucible, the lower portion, including the bottom, of the crucible is kept at a lower temperature than the upper portion of the crucible. This is also apparent from the sharp leading edges of the gradients L1 and L2 shown in FIG. 4. Since the temperature T2 detected by the thermocouple 6 is maintained at the constant value T20 as mentioned above, and the heating through the upper portion and the sidewall of the crucible is continuous, the temperature T1 detected by the second thermocouple 13 increases along with the temperature T2 detected by the first thermocouple 6, though more slowly. As shown in FIG. 4, the gradient of L1 becomes flat (at time t2 about 2.5 hours after t1) as the temperature approaches the melting temperature of the silicon. As described above, since the polysilicon absorbs heat to melt during the flat-gradient period, the temperature T1 detected by the second thermocouple 13 is prevented from increasing. Therefore, the rate ΔT (° C./min.) of time-dependent change of the temperature T1 detected by the second thermocouple 13 is monitored based on the output from the second thermocouple 13, and when ΔT reaches a predetermined value (e.g., 0.2° C./min.) or more (at time t3 about 4 hours after t2), the process proceeds to the next step a3 to lower the temperature T2 detected by the first thermocouple 6 at a temperature gradient of 300° C./hr. by the controller 7. Step a2 is repeated while maintaining the temperature T2 detected by the first thermocouple 6 at the original predetermined value T20 so long as determination at step a2 results in a "NO".

At step a3, the temperature T2 detected by the first thermocouple 6 is further lowered until it reaches a predetermined temperature T21 (e.g., approximately 1,450° C.) (at time t4 about 0.3 hours after t3), at which time the process proceeds to step a4. At step a4, the falling rate of the temperature T2 detected by the thermocouple 6 is decreased from the 300° C./hr. at step a3 to 1° C./hr. for slow cooling inside the heating furnace 4. Simultaneously, the pedestal 11 is lowered by the driving means 16 (at a lowering speed on the order of 7–10 mm/hr.). The temperature T2 detected by the first thermocouple 6 is lowered rather gently in this way, and when T2 reaches a predetermined temperature T22 (e.g., approximately 1,425° C.) (at time t5 about 25 hours after t4) at step a4, the process proceeds to step a5, where the pedestal 11 is lowered on, while the falling rate of the temperature T2 detected by the first thermocouple is more increased. In the foregoing steps a1 through a5, preferably the pedestal is rotated at a speed of 1 rpm or less so that the temperature of the melting polysilicon is properly controlled as described above.

At step a5, after full solidification of the silicon has been ascertained (about 15 hours later), the crucible 9 is taken out of the airtight vessel 1. The produced polysilicon ingot is removed from the crucible 9 to provide polycrystalline silicon which has solidified in a single direction from the bottom to the top of the crucible. Typically, it takes around 51 hours to finish steps a1 through a5.

The present invention may be very advantageously carried out by presetting the setting temperatures T20, T21 and T22, the rate ΔT of time-dependent change of the temperature detected by the second thermocouple 13, which are referred to at steps a1, a2, a3 and a4, to appropriate values which are inputted to a computer so as to allow subsequent judgment at each step based on whether found values have reached these preset values, and to control the controller 7 in order to carry out the steps of controlling the temperature and cooling in the heating furnace 4.

As described above, by the process for producing a polycrystalline semiconductor according to the present invention, since only the raw semiconductor material charged into the crucible is melted, without melting the seed crystals placed on the bottom of the crucible, and the raw semiconductor material is solidified to a crystal by cooling from the bottom of the crucible, the crystal grows in one direction from the bottom to the top of the crucible to provide a high-quality polycrystalline semiconductor with excellent crystallographic properties.

In addition, according to the present invention, since a thermocouple is provided at the bottom underside of the crucible to detect the rate ΔT of time-dependent change of the underside temperature T1 of the crucible while the raw semiconductor material is heated to a melt, to thereby control the heating and the cooling steps to prevent the seed crystals from melting, with a high degree of reliability. As a result, the process for producing a polycrystal according to the present invention is very repeatable, and the temperature control is ensured by simply burying a single thermocouple in the top of the supporting bed which is in contact with the bottom underside of the crucible; therefore the producing process of the present invention may be carried out at a lower cost. In addition, since the temperature control, the cooling, the heating and the location of the crucible as described above may be accomplished with single control means, it is possible to automate all the steps of the crystal growth process. Furthermore, the value of ΔT set within the range of approximately 0.2° C./min. to approximately 0.5° C./min. allows prevention of melting of the seed crystals, and thus the quality of the polycrystalline semiconductor is further improved.

The process for producing a polycrystalline semiconductor according to the present invention, which may be applied not only to production of polycrystalline silicon, but also as a process for crystallizing other raw semiconductor materials, has thus very great value in industrial applications.

EXAMPLE 1

Silicon seeds ((CZ(100), 5 inches in diameter and 10 mm in thickness)) were placed on the bottom center of a crucible (a square pole 55 cm in width and 40 cm in height). Preferably silicon seeds pre-treated by chemical etching (30 μ) are used. The etching provides smoother crystal surfaces suitable for crystal growth. Approximately 140 kg of polysilicon to be melted was charged into the crucible.

Steps a1 through a2 described above were carried out to produce a polycrystalline silicon ingot.

The polycrystalline silicon produced in this example (although it can be made available for semiconductor products) was used as a specimen to check for the crystalline state of the silicon.

Separately, fresh polysilicon was charged into the crucible under substantially the same conditions as described above, processed at step a1, and then at step a2 while variously changing the setting of the rate ΔT of time-dependent change of the temperature T1 detected by the second thermocouple 13, and steps a3 through a5 described above were subsequently repeated. The finished ingots were pulled out and cut into a given size, and the cross-sections were observed to evaluate the progress of melting of the seed crystals. The results of evaluation are given in Table 1.

TABLE 1

| ΔT (°C./min) | State of seed crystals |
| --- | --- |
| ΔT < 0.2 | Both the seed crystals and part of the polysilicon remain unmelted. |
| 0.2 ≦ ΔT ≦ 0.5 | Only the seed crystals remain unmelted. |
| 0.5 < ΔT < 1.0 | Some of the seed crystals melted, and some reamin unmelted. |
| ΔT > 1.0 | The seed crystals were completely melted. |

As is apparent from the above table, the crystal grew without melting the seed crystals in cases where the setting of the rate ΔT of time-dependent change of the temperature T1 detected by the second thermocouple 13 was 0.5° C./min. The seed crystals melted, or both the seed crystals and the polysilicon remained unmelted in cases where the setting of the rate ΔT of time-dependent change of the temperature T1 detected by the second thermocouple 13 was less than 0.2° C./min. or greater than 0.5° C./min. Therefore, it may be concluded that the rate ΔT of time-dependent change of the temperature T1 detected by the second thermocouple 13 should be within the range of 0.2° C./min. to 0.5° C./min.

EXAMPLE 2

Sixteen silicon seeds (CZ(100), 5 inches in diameter and 10 mm in thickness)) in a 4×4 array were placed over the entire bottom surface of the same crucible as used in Example 1. Reference should be made to FIG. 3. Approximately 140 kg of polysilicon was spread on the silicon seeds in the crucible, and steps a1 through a5 were repeated under substantially the same conditions as the above to produce a polycrystalline silicon ingot. At step a2 in the present example, however, the rate ΔT of time-dependent change of the temperature T1 detected by the second thermocouple 13 was set to 0.4° C./min. instead of 0.5° C./min. The resulting polycrystalline silicon ingot was cut in the same manner as in Example 1 to observe the cross-section, which revealed that the outer portion of the ingot which faced the wall of the crucible contained some melted seed crystals. This is believed to have been caused by the distribution of temperature inside the crucible, which increases from the center to the wall of the crucible. Such distribution of temperature is often caused, since the heating member is located in the heating furnace at a shorter distance from the sidewall of the crucible than from the center of the crucible.

When the present example was repeated with the exception that the rate ΔT of time-dependent change of the temperature T1 detected by the second thermocouple 13 was set to 0.2° C./min., observation of the cross-section of the ingot revealed that the polysilicon on the seed crystals located in the center remained unmelted.

EXAMPLE 3

As in Example 2, silicon seeds (CZ(100)), 5 inches in diameter and 10 mm in thickness) were placed on the bottom of the crucible, in a square around the bottom center, with four seed crystals along each side of the square including the ones at each corner of the square (a total of 12 pieces), and four seed crystals of the same type as above except that the thicknesses were 20 mm, placed on the bottom center. Approximately 140 kg of polysilicon was spread on the seed crystals, and steps a1 through a5 were repeated under substantially the same conditions as the above to produce a polycrystalline silicon ingot. At step a2 in the present example, however, the rate ΔT of time-dependent change of the temperature T1 detected by the second thermocouple 13 was set to 0.2° C./min. instead of 0.5° C./min. The resulting ingot was cut to observe the cross-section, and it was ascertained that all the seed crystals remained unmelted, and the polysilicon around the seed crystals was melted and then solidified to form a crystal.

As is clear from the results of the foregoing examples, in cases where a silicon polycrystal is grown from silicon seeds laid on the bottom of a crucible according to the process of the present invention, preferably the thicknesses of the silicon crystal seeds used are 10 mm or greater. This is because a thickness smaller than 10 mm may cause melting of seed crystals situated peripherally. It is also preferred for the thickness of the seed crystals placed in the bottom center to be greater than the thickness of the seed crystals situated peripherally. For example, the thickness of the seed crystals placed in the bottom center is preferably approximately 20 mm when the peripheral seed crystals are 10 mm in thickness.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which tome within the meaning and the range of equivalency of the claims are therefore intended to be embraced therein.

What claimed is:

1. A process for producing a polycrystalline semiconductor comprising the steps of:

charging a raw semiconductor material into a crucible with semiconductor seed crystals placed on a bottom thereof in an atmosphere inert to the semiconductor;

heating and melting the raw semiconductor material in the crucible by heating means while depriving the bottom of the crucible of heat to maintain the underside temperature T1 of the bottom below the melting point of the raw semiconductor material; and then cooling the crucible to solidify the melted material, wherein the underside rate $\Delta T$ (° C./min) of increase of temperature T1 of the bottom of the crucible under heating is measured and maintained within the range of from about 0.2° C./min to about 0.5° C./min to thereby melt only the raw semiconductor material without melting the seed crystals, and wherein the melted raw material is then solidified to grow a polycrystal from the seed crystals.

2. The process according to claim 1, wherein the seed crystals are spread on the entire bottom surface of the crucible.

3. The process according to claim 1, wherein the seed crystals are about 10 mm or more in thickness.

4. The process according to claim 1, wherein the thickness of the seed crystals are greater at the center of the crucible than at a periphery thereof.

5. The process according to claim 1, wherein the raw semiconductor material is polysilicon and the polycrystalline semiconductor is polycrystalline silicon.

* * * * *